(12) United States Patent
Chaves

(10) Patent No.: US 8,292,178 B2
(45) Date of Patent: Oct. 23, 2012

(54) INTEGRATED SMART LABEL

(75) Inventor: Leonardo Weiss F. Chaves, Karlsruhe (DE)

(73) Assignee: SAP AG, Walldorf (DE)

( * ) Notice: Subject to any disclaimer, the term of this patent is extended or adjusted under 35 U.S.C. 154(b) by 235 days.

(21) Appl. No.: 12/561,730

(22) Filed: Sep. 17, 2009

(65) Prior Publication Data

US 2011/0062237 A1    Mar. 17, 2011

(51) Int. Cl.
*G06K 7/10* (2006.01)

(52) U.S. Cl. ............... 235/462.01; 235/494; 235/454

(58) Field of Classification Search ............ 235/454, 235/462.01, 492, 494
See application file for complete search history.

(56) References Cited

U.S. PATENT DOCUMENTS

| | | | |
|---|---|---|---|
| 5,535,871 A * | 7/1996 | Harbaugh | 194/206 |
| 6,255,948 B1 * | 7/2001 | Wolpert et al. | 340/572.8 |
| 6,259,369 B1 * | 7/2001 | Monico | 340/572.8 |
| 6,371,375 B1 * | 4/2002 | Ackley et al. | 235/462.45 |
| 6,830,192 B1 * | 12/2004 | Krul et al. | 235/492 |
| 7,077,332 B2 * | 7/2006 | Verschuur et al. | 235/492 |
| 7,133,124 B2 * | 11/2006 | Puttkammer | 356/71 |
| 7,284,704 B2 * | 10/2007 | Lubow | 235/462.01 |
| 7,315,248 B2 | 1/2008 | Egbert | |
| 7,483,275 B2 * | 1/2009 | Clemens et al. | 361/760 |
| 7,504,953 B2 | 3/2009 | Forster | |
| 7,546,948 B2 * | 6/2009 | Maranov | 235/462.01 |
| 2005/0284941 A1 * | 12/2005 | Lubow | 235/462.01 |
| 2009/0068340 A1 | 3/2009 | Junghans et al. | |

OTHER PUBLICATIONS

Rhea Wessel, "VTT Is Developing Printed Sensors," RFID Journal, Jun. 11, 2007, 2 pages.

* cited by examiner

*Primary Examiner* — Daniel Hess
(74) *Attorney, Agent, or Firm* — Fish & Richardson P.C.

(57) ABSTRACT

Implementations of the present disclosure provide an integrated smart label, comprising a plurality of electronic components, each of the electronic components including a profile defining at least a portion of a machine-readable indicia, at least one of the electronic components storing first data, and the machine-readable indicia being a visual representation of second data. Implementations of the present disclosure also provide a method of producing an integrated smart label, and a system employing an integrated smart label.

20 Claims, 5 Drawing Sheets

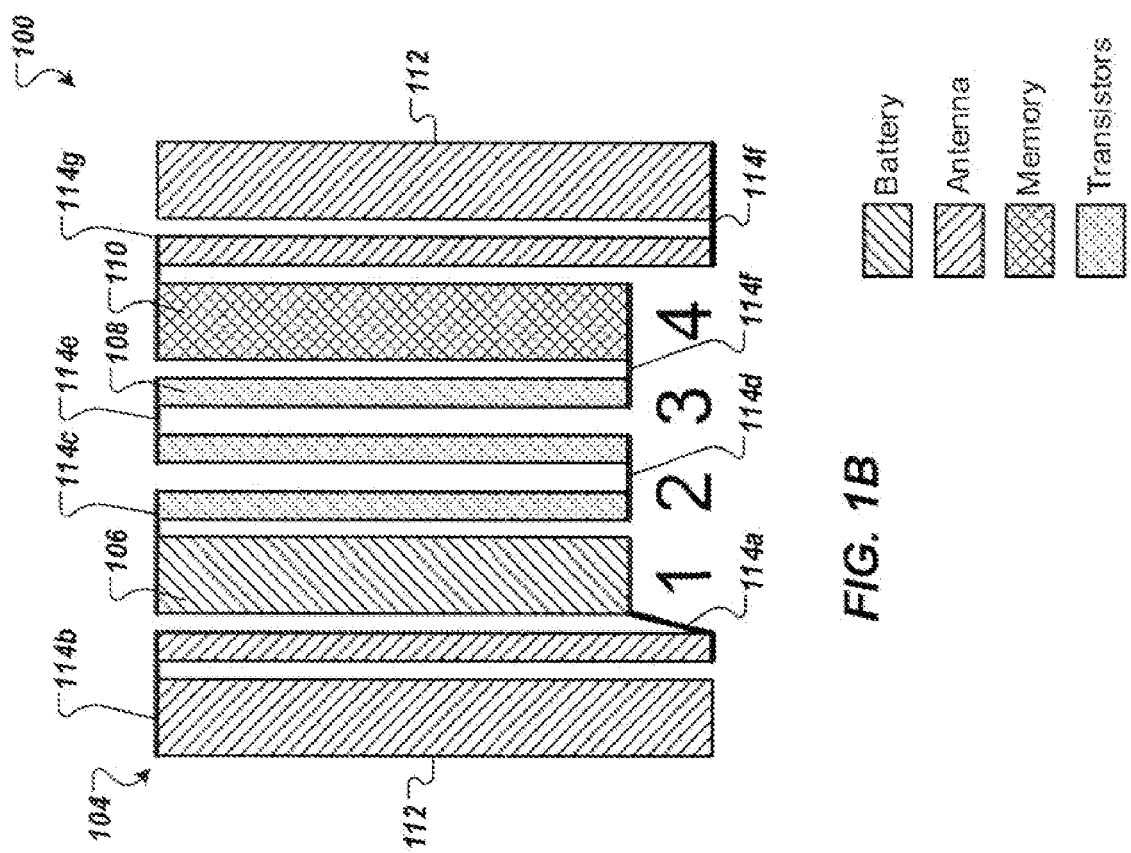
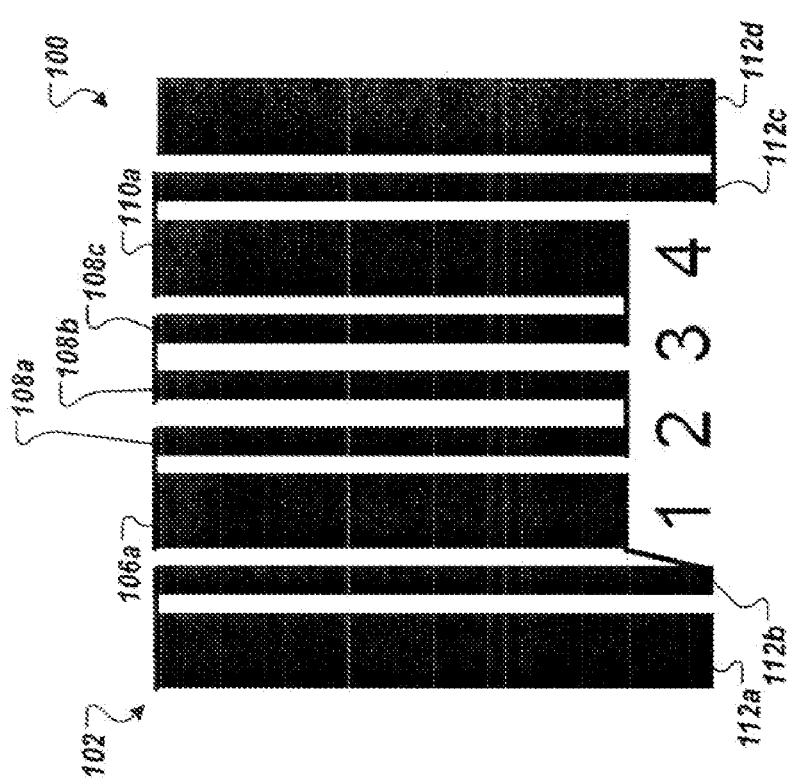
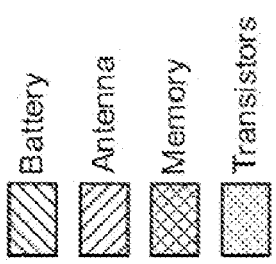
FIG. 1A
FIG. 1B

INTEGRATED SMART LABEL

BACKGROUND

A large-scale manufacturing facility can manage the handling of goods and materials (e.g., items used in a manufacturing process) using printed labels. Each good or material can have a printed label associated with it that can include unique identification information for the good or material. For example, the label can be printed directly on the item or the label can be printed separately and later attached to the item. The printed labels can include machine-readable indicia that the manufacturing facility can use to identify and track the item. For example, the manufacturing facility can track items as they move through the facility. In another example, the items may be tracked after they leave the manufacturing facility as they are transported and sold to a customer. The use of printed labels with machine-readable indicia can automate and standardize a material identification process.

SUMMARY

Implementations of the present disclosure provide an integrated smart label, including a plurality of electronic components, each of the electronic components including a profile defining at least a portion of a machine-readable indicia, at least one of the electronic components storing first data, and the machine-readable indicia being a visual representation of second data.

In some implementations, at least one of the plurality of electronic components includes printed electronics.

In some implementations, at least one of the plurality of electronic components includes organic electronics.

In some implementations, the machine-readable indicia is further defined by at least one profile that is distinct from profiles of the plurality of electronic components.

In some implementations, wherein the first data includes the second data and additional data.

In some implementations, at least one of the electronic components includes a color that is machine-detectable.

In some implementations, wherein the plurality of electronic components includes at least one of memory, circuitry, a battery and an antenna.

In some implementations, the electronic components define a radio-frequency identification (RFID) tag.

In some implementations, the machine-readable indicia includes one of a one-dimensional indicia and a two-dimensional indicia.

Implementations of the present disclosure further provide a method of producing an integrated smart label. In some implementations, a method includes generating a plurality of electronic components, each of the electronic components including a profile, arranging the plurality of electronic components to define at least a portion of a machine-readable indicia, and storing first data in at least one of the electronic components, wherein the machine-readable indicia is a visual representation of second data.

In some implementations, generating includes printing at least one of the plurality of electronic components.

In some implementations, at least one of the plurality of electronic components includes organic electronics.

In some implementations, the method further includes generating at least one profile that defines at least a portion of the machine-readable indicia, and that is distinct from profiles of the plurality of electronic components.

In some implementations, the plurality of electronic components includes at least one of memory, circuitry, a battery and an antenna.

In some implementations, the electronic components define a radio-frequency identification (RFID) tag.

In some implementations, the machine-readable indicia includes one of a one-dimensional indicia and a two-dimensional indicia.

Implementations of the present disclosure also provide a system for reading data, including an integrated smart label. In some implementations, a system includes a plurality of electronic components, each of the electronic components including a profile defining at least a portion of a machine-readable indicia, at least one of the electronic components storing first data, and the machine-readable indicia being a visual representation of second data, and a device for reading at least one of the first data and the second data from the integrated smart label.

In some implementations, the integrated smart label is printed directly on an item.

In some implementations, the integrated smart label is printed to a sticker that is subsequently affixed to an item.

In some implementations, the device comprises at least one of an optical scanner, and a smart label reader.

The details of one or more implementations of the present disclosure are set forth in the accompanying drawings and the description below. Other features and advantages of the present disclosure will be apparent from the description and drawings, and from the claims.

DESCRIPTION OF DRAWINGS

FIGS. 1A and 1B illustrate an exemplar integrated smart label that includes machine-readable indicia and printed electronics.

Like reference symbols in the various drawings indicate like elements.

DETAILED DESCRIPTION

Figures 2A, 2B:
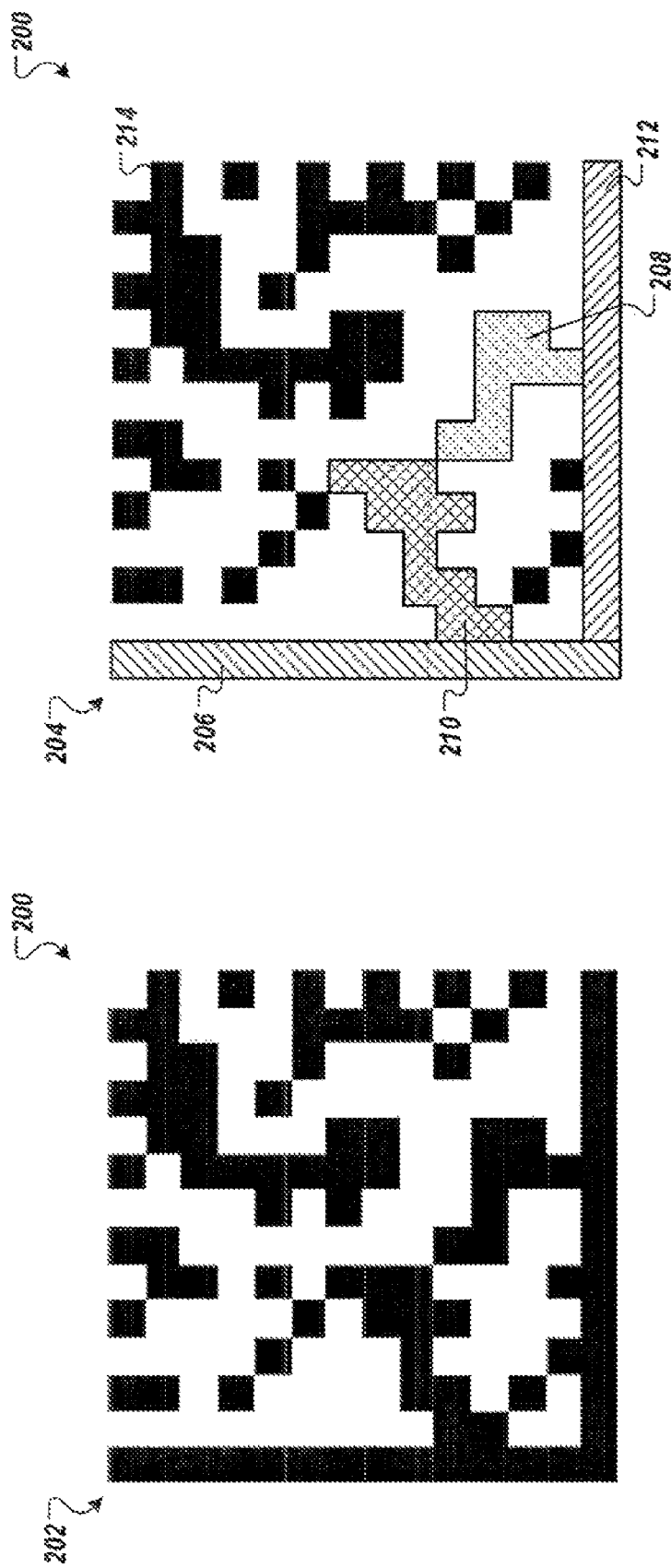
FIGS. 2A and 2B illustrate an exemplar alternative integrated smart label that includes machine-readable indicia and printed electronics.

A manufacturing facility can automate and standardize a material identification process by printing machine-readable indicia directly on a good or material (e.g., an item used in the manufacture of a product or the finished product) or by printing a label with machine-readable indicia that can be attached to the item. Examples of machine-readable indicia can include, but are not limited to, bar codes. There exists a plurality of bar code types and standards. For example, a bar code can be a series of variable width, variable spaced vertical lines or a data matrix symbol. The bar code types can be a coded representation of a series of alpha-numeric characters. A human can visually read a bar code and a machine (e.g., a scanner) can read (e.g., optically scan and decode) a bar code.

For example, a machine bar code reader can include an optical scanner, a decoder and a mechanism for communicating the decoded information to a computer system for eventual processing. The machine reader needs to be placed within a line of sight of the bar code in order to optically read the bar code information and identify the item.

A manufacturing facility can also automate and standardize a material identification process using radio frequency identification technology (RFID). An RFID tag can include an antenna, a semiconductor chip attached to the antenna and a form of encapsulation (e.g., a glass vial or a laminar plastic substrate). The encapsulation can maintain the integrity of the RFID tag and protect the tag components from adverse environmental conditions or contaminants. For example, compared to a bar code label that includes visual machine-readable indicia for a single unique identification code for an item, an RFID tag can support a larger set of unique identification codes. The RFID tag can incorporate additional data including, but not limited to, manufacturer identification codes and product type codes. The semiconductor chip in the RFID device can store a plurality of encoded data. An RFID reader can read the data stored in the semiconductor device, decode it and provide it to a computer system for eventual processing.

The use of RFID tags in a manufacturing facility can provide the material identification equipment and processes the ability to identify the RFID tagged items from a distance without the line of sight requirement needed to identify a bar code label. Additionally, use of RFID tags in a manufacturing facility can enable the material identification equipment and processes the ability to discern from among many different RFID tags located in the same area without human assistance.

In some implementations, a passive RFID tag can include an encapsulated antenna and semiconductor device and an RFID tag reader can be responsible for powering and communicating with the RFID tag. In some implementations, an active RFID tag can include an encapsulated antenna and semiconductor device as well as an active power source (e.g., a powered infrastructure or an integrated battery).

In some implementations, a good or material can include both a printed label with machine-readable indicia (e.g., a bar code label) and an RFID tag. The material identification process can include the use of both bar code readers and RFID tag readers. For example, a retail item can include both a printed label (e.g., a bar code) and an RFID tag, each of which can contain unique identification codes for the item. An RFID system in a manufacturing facility can track the retail item during manufacturing. Systems using bar code readers can track the retail item during shipment, placement and subsequent sale of the item. However, the inclusion of a printed label and an RFID tag on a single item can add additional cost to the item as well as the challenge as to where to place multiple labels on the item.

In some implementations, a smart label or smart tag can include a previously fabricated encapsulated RFID tag placed under a conventional printed label, where the printed label can include machine-readable indicia (e.g., a bar code). For example, the printed label can be printed and affixed to the RFID tag. In another example, the printed label can be printed directly on the surface of the encapsulated RFID tag. The smart label can be constructed using paper, plastics or fabric. The smart label attached to an item can enable the use of material identification in a manufacturing facility. For example, a smart label attached to a manufactured item (e.g., an article of clothing, an electronic device) can allow tracking of the item through manufacturing, shipping, retail store placement and final customer sale using both RFID reader based systems and bar code reader based systems.

A label printer can use a variety of printing methods and inks to print a bar code label. A label printer can use graphic arts inks to print a human readable as well as machine-readable label (e.g., a bar code label). Exemplar label printers include, but are not limited to, the PC41 Desktop Printer provided by Intermec, Inc., the 105SL label printer provided by Zebra Technologies Corporation, and the M-4206 label printer provided by Datamax Corporation.

Organic electronics (e.g., plastic electronics or polymer electronics) can involve the use of carbon-based electronically conductive polymers. For example, printing methods using one or more functional inks composed of carbon-based compounds can create electronically functional devices by printing organic electronics. A label printer can use these special conductive inks to print the organic electronics (e.g., electronic circuits) on paper, plastics or fabrics. In some implementations, printing methods using one or more functional inks containing silver or other metals can create electronically functional devices (e.g., antennas). In some implementations, a label printer can use one or more graphic arts inks to create machine-readable indicia on a printed label.

In some implementations, a printer can use one or more functional inks to create electronically functional devices (e.g., electronic circuits) on a printed label. Although functional inks can be used to print electronics using any conventional printer, some printer manufacturers explicitly state their product as being capable of printing electronics. By way on non-limiting example, one such printer is the IP500 Industrial Print System provided by PixDro b.v. Exemplar functional inks can include, but are not limited to, DuPontT Solamet® Ink provided by DuPont Teijin Films U.K. Ltd., Plexcore® OC organic conductive inks provided by Plextronics, Inc., and Parmod® inks provided by Parelec, Inc.

Referring now to FIGS. 1A and 1B, an exemplar integrated smart label 100 is illustrated and can include machine-readable indicia 102 defined by underlying electronics 104. The machine-readable indicia 102 (e.g., bar code) can represent a unique alpha-numeric identification code associated with an item (e.g., a serial number, a Universal Product Code (UPC), a Global Trade Item Number (GTIN)). In the example of FIGS. 1A AND 1B, the machine-readable indicia 102 are a bar code representation of the exemplar numeric characters (e.g., 1, 2, 3 and 4). In some implementations, a manufacturing or other type of facility can use a bar code reader located within a line of sight of an appropriately oriented item to read the bar code on the item. The bar code reader can decode the bar code to determine the alpha-numeric identification code associated with the item. This alpha-numeric identification code can be communicated to a computer located within the facility that can identify the item knowing its unique identification code.

The exemplar integrated smart label 100 of FIGS. 1A and 1B, however, can also function as an RFID label. More specifically, a scanner can be implemented to write and/or read data to/from the integrated smart label 100. As noted above, the RFID functionality supports larger set of data including, but not limited to, unique identification codes, manufacturer identification codes and product type codes.

In some implementations, a manufacturing facility can associate additional data with each of the goods and materials used in the facility. As described above, the use of an RFID tag on an item can allow additional data (e.g., a larger set of unique identification codes) to be associated with the item as compared to a bar code which allows for only one identification code to be associated with the item. In some implementations, a manufacturing facility may use special software with an RFID system to manage the use of RFID tags and the additional data they provide. The software can be capable of determining the format of the data and can manage the decoding and processing of the data. For example, a manufacturing facility can use an RFID system to gather data about the item by reading its RFID tag at different stages of the manufacturing process as it moves throughout the manufacturing facility without the need for correctly orientating the item within a line of site of a bar code reader. However, the use of special software with an RFID system can add additional expense and overhead to a manufacturing process.

In some implementations, an item can include a printed label with machine-readable indicia (e.g., a bar code) and an RFID tag. As described above, the RFID system can read a smart label to obtain a plurality of unique identification codes for the item and a bar code reader can read the bar code to obtain a single identification code for the item. The use of both types of labels on an item can allow tracking of the item using either or both labels at different points in the product cycle. For example, an RFID system can track the item through the manufacturing process in a factory and systems using a bar code reader can track the item from the factory to the customer.

The integrated smart label 100 visually appears as machine-readable indicia 102, yet can be defined by the electronics 104 that comprise an RFID tag. For example, the electronics can be printed using functional inks. More specifically, the printing process can print the integrated smart label 100 as electronic circuits in a pattern that a standard bar code reader can read. In the implementation of FIGS. 1A and 1B, the machine-readable indicia 102 is a bar code with a series of variable width, variable spaced vertical lines. In the implementation of FIGS. 1A and 1B, the printed electronics 104 create an active RFID tag whose components include a battery 106, transistors 108, memory 110 and antenna 112. The printed electronics 104 can also include the interconnections between the components (e.g. interconnections 114a to 114h). The integrated smart label 100 can include both the machine-readable indicia 102 for a single unique identification code for an item as well as additional identification codes included in the printed electronics 104 of the RFID tag. In some implementations, the RFID tag can include the unique identification code of the bar code as well as additional identification codes for the item.

In some implementations, the functional inks can print a passive RFID tag that does not require a power source (e.g., a battery). In some implementations, the functional inks can print a passive RFID tag including additional passive components (e.g., capacitors) used to help supply power to the RFID tag when needed. The integrated smart label 100 integrates an RFID tag and machine-readable indicia into a single printed label. The integrated smart label 100 can be a smart label generated by a label printer using functional inks.

In some implementations, the label printer can print the integrated smart label 100 on paper, plastic or fabric. In some implementations, a label printer can print the integrated smart label 100 directly on the item. In some implementations, the label printer can print the integrated smart label 100 on labels that can be attached to the item (e.g., the printer can print the integrated smart label 100 on a sheet or roll of adhesive labels where each label can be attached to its associated item).

The integrated smart label 100 can be placed on an item as a single printed label with machine-readable indicia that includes both bar code and RFID functionality without the need for a separate printed label with machine-readable indicia and a separate RFID tag. This can create a more aesthetically pleasing package for the item as well as help in reducing packaging costs. Additionally, an RFID reader as well as a bar code scanner can read the integrated smart label 100 interchangeably. This can allow for a gradual transition from the use of bar code readers and bar code labels to RFID systems reading RFID tags as RFID systems become easier to implement and less costly.

In some implementations, the use of the integrated smart label 100 can allow different types of systems to track the item in different areas and at different points in time. In some instances, an RFID reader based system can track the item and in other instances, a system that reads machine-readable indicia (e.g., a bar code reader based system) can track the item.

A printer can print the machine-readable indicia for a bar code (e.g., the vertical lines, the data matrix) as dark indicia on a light background in order for a bar code reader to accurately scan and decode the bar code. This allows for sufficient contrast between the indicia and the background for the reader to distinguish the indicia from the background and therefore properly read and decode the indicia. In the implementation of FIGS. 1A and 1B, the machine-readable indicia 102 are a black bar code on a white background. However, a bar code printer can use other single colors to print the bar code label as long as the colors are saturated enough to be distinguished by the bar code reader from a light or white background.

In some implementations, a color label printer can print black machine-readable indicia on a white background using a three-color printing process (e.g., red, green and blue) to create the color black. In some implementations, a color label printer using a combination of graphic arts and functional inks can print an integrated smart label 100. For example, the color label printer can use a red functional ink to print the printed electronics 104 and green and blue graphic arts inks to print over the printed electronics 104 to create black machine-readable indicia 102. In some implementations, a color label printer using graphic arts inks and functional inks in a four-color printing process (e.g., red, green and blue functional inks and black for the graphic arts ink) can print an integrated smart label 100. For example, the color label printer can print each component in a different color (e.g., the printer can print the battery 106 and antenna 112 in red, the transistors 108 in green and the memory 110 in blue). This can result in a multi-color label. The black graphic arts ink can print the machine-readable indicia 102 in black over the printed electronics 104 for the resultant integrated smart label 100. This can ensure that a bar code reader can read the bar code of the machine-readable indicia 102.

In the implementation of FIGS. 1A and 1B, each indicium in the machine-readable indicia 102 (e.g., each vertical bar in the bar code) includes printed electronics. In some implementations, many of the indicium in the machine-readable indicia may not include electronics (e.g., vertical bars in the bar code may not include printed electronics). In this implementation, the machine-readable indicia can require more indicium to represent a unique identification code than the number of electronic components needed to create an RFID tag. For example, when printing the integrated smart label with functional inks, the machine-readable indicia can include passive components in the indicium. For example, when printing the integrated smart label with a combination of functional and graphic arts inks, the label printer can print the machine-readable indicia where certain indicium are printed with functional inks and certain indicium are printed with graphic arts inks only.

In some implementations, an integrated smart label can include components not printed in an indicium of the machine-readable indicia using functional ink. For example, a label printer can print a partial integrated smart label that incorporates an active RFID tag that includes the printed electronic components for an antenna, transistors and memory for the RFID tag. The battery for the RFID tag can be a pre-manufactured, external component connected to the partial integrated smart label. In another example, a label printer can print a partial integrated smart label that incorporates a passive RFID tag that includes printed electronic components for an antenna, and transistors. The memory for the RFID tag can be an external component connected to the partial integrated smart label. For example, it may be necessary to create partial integrated smart labels in situations where the number of indicium in a bar code does not provide enough print area for the necessary electronics needed for an RFID tag.

Referring now to FIGS. 2A and 2B, another exemplar implementation of an integrated smart label 200 is illustrated and can include machine-readable indicia 202 and printed electronics 204. In the implementation in FIGS. 2A and 2B, the machine-readable indicia 202 comprise a matrix code in the form of a two-dimensional (2D) bar code, which can represent alpha-numeric data in two-dimensions. The 2D barcode can provide increased data representation capacity in comparison to a linear or one-dimensional barcode (e.g., machine-readable indicia 102 in FIGS. 1A and 1B). In some implementations, a manufacturing or other type of facility can use a 2D bar code reader located within a line of sight of an appropriately oriented item to read the 2D bar code on the item. The bar code reader can decode the bar code to determine the alpha-numeric identification code associated with the item. This alpha-numeric identification code can be communicated to a computer located within the facility that can identify the item by knowing its unique identification code.

The integrated smart label 200 can visually appear as machine-readable indicia 202 and can be printed using functional inks for printing the electronics 204 that comprise an active RFID tag. For example, as shown in FIGS. 2A and 2B, a label printer can print the integrated smart label 200 as electronic circuits in a pattern that a bar code reader capable of reading 2D bar codes can read. In the implementation in FIGS. 2A and 2B, the machine-readable indicia 202 are a 2D bar code that includes sequential squares in a two-dimensional array where the printed squares in the array determine the machine-readable indicia. In the implementation in FIGS. 2A and 2B, the printed electronics 204 create an active RFID tag whose components include a battery 206, transistors 208, memory 210 and antenna 212. The printed electronics 204 can also include the interconnections between the components. In the implementation in FIGS. 2A and 2B, the machine-readable indicia 202 can include more indicia than needed to accommodate the printed electronics for an RFID tag. The indicia not included as electronic components in the integrated smart label 200 can comprise passive components 214 (areas shown in black for the printed electronics 204). A label printer can print the passive components 214, battery 206, antenna 212, memory 210 and transistors 208 using functional inks or a combination of functional inks and graphic arts inks to create the integrated smart label 200 with machine-readable indicia 202 in a similar manner as described with reference to FIGS. 1A and 1B.

A material identification system can use a 2D bar code reader to read the machine-readable indicia 202 (e.g., a 2D bar code). The material identification system can decode the indicia to determine the unique identifier code associated with the item to determine the identity of the labeled item. The integrated smart label 200 can include both the machine-readable indicia 202 for a single unique identification code for an item as well as additional identification codes included in the printed electronics 204 of the RFID tag.

The capabilities and implementations described with reference to the integrated smart label 100 and the use of a one-dimensional bar code can be applied to the integrated smart label 200 and the use of a two-dimensional bar code.

Figure 3B:
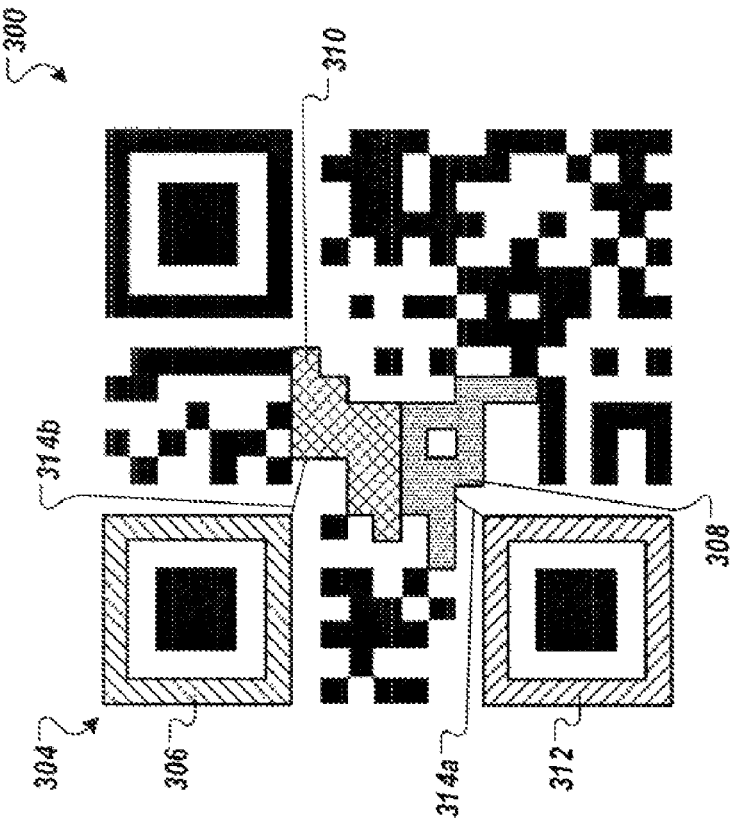
FIGS. 3A and 3B illustrate another exemplar alternative integrated smart label that includes machine-readable indicia and printed electronics.
Figure 3A:
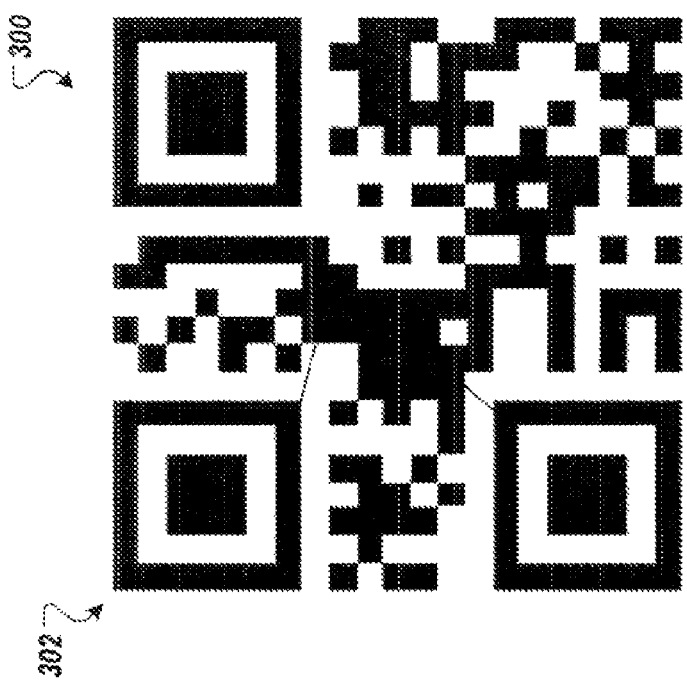

Referring to FIGS. 3A and 3B, another exemplar implementation of an integrated smart label 300 is illustrated and can include machine-readable indicia 302 and printed electronics 304. In the implementation in FIGS. 3A and 3B, the machine-readable indicia 302 comprise a specific matrix code in the form of a 2D bar code referred to as a quick response (QR) code. A QR code can store address and Universal Resource Locators (URLs). For example, QR codes can be printed in magazines, on signs and additional objects a user may desire information about. In some implementations, a smart phone, personal data assistant (PDA) or other personal data device can include specialized software and a bar code scanner that can scan the image of the QR code. On image scanning, the device can launch its browser directed to the scanned decoded URL, which can provide a "hardlink" or physical hyperlink to occur between the scanned, decoded URL in the QR code and the users' personal data device (e.g., a physical world object).

The integrated smart label 300 can visually appear as machine-readable indicia 302 and can be printed using functional inks for printing the electronics 304 that comprise an active RFID tag. For example, as shown in FIGS. 3A and 3B, a label printer can print the integrated smart label 300 as electronic circuits in a pattern that can be read by a bar code reader capable of reading QR codes. In the implementation in FIGS. 3A and 3B, the machine-readable indicia 302 are a 2D bar code in the form of a QR bar code. In the implementation of FIGS. 3A and 3B, the printed electronics 304 create an active RFID tag whose components include a battery 306, transistors 308, memory 310 and antenna 312. The printed electronics 304 can also include the interconnections (e.g., interconnections 314a, 314b) between the components. In the implementation in FIGS. 3A and 3B, the machine-readable indicia 302 can include more indicia than needed to accommodate the printed electronics for an RFID tag. The indicia not included as electronic components in the integrated smart label 300 can comprise passive components 316 (areas shown in black for the printed electronics 304). A label printer can print the passive components 316, interconnections 314a, 314b, battery 306, antenna 312, memory 310 and transistors 308 using functional inks to create the integrated smart label 300 with machine-readable indicia 302. The integrated smart label 300 can include both the machine-readable indicia 302 for a QR code on an item as well as additional identification codes included in the printed electronics 304 of the RFID tag.

The capabilities and implementations described with reference to the integrated smart label 100 and the use of a one-dimensional bar code can be applied to the integrated smart label 300 and the use of a two-dimensional QR code.

Figure 4:
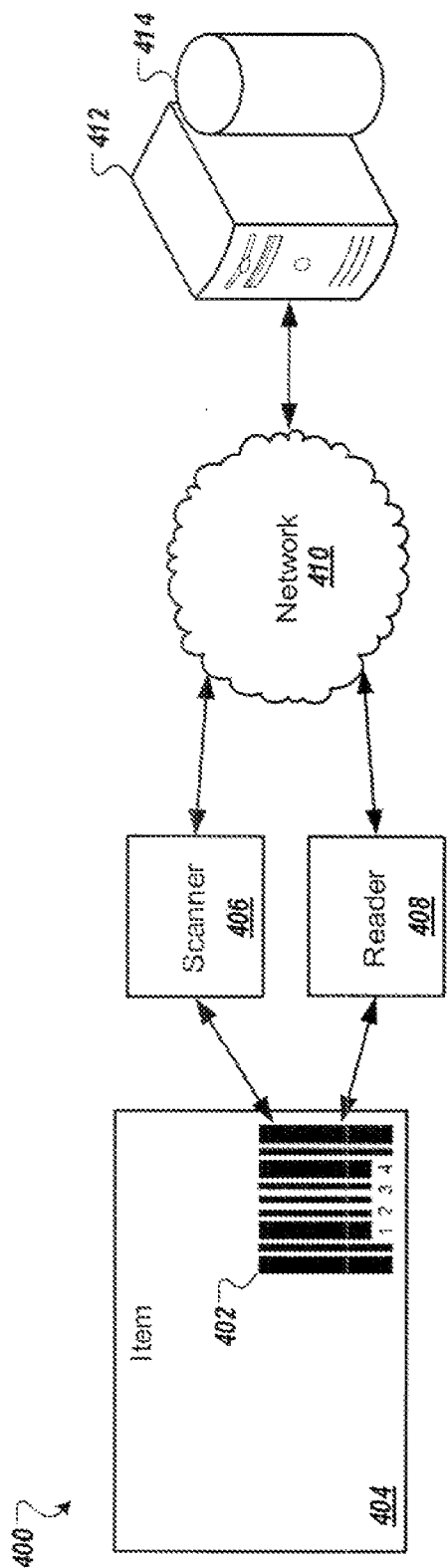
FIG. 4 is a diagram of an exemplar integrated smart label included on an item and an exemplar system that can scan and read the label.

Referring now to FIG. 4, a diagram of an exemplar integrated smart label 402 included on an item 404 in an exemplar system 400 can include scanner 406 and RFID reader 408. The implementation in FIG. 4 includes the integrated smart label 402 with machine-readable indicia (e.g., a one-dimensional bar code as described with reference to FIGS. 1A and 1B) on item 404. A scanner 406 (e.g., an optical bar code scanner) can scan the label 402 and read and decode the machine-readable indicia determining the unique identification code (e.g., a serial number, UPC code or GTIN number for the item) associated with the item 404. The scanner 406 can send the decoded unique identification code by way of network 410 to computer 412 that includes database 414.

An RFID reader 408 can read the RFID tag included in the integrated smart label 402. The RFID reader can decode the additional data included in the RFID tag (e.g., manufacturer identification codes and product type codes) associated with the item 404. The RFID reader 406 can send the additional decoded identification codes by way of network 410 to computer 412 that includes database 414.

In some implementations, a manufacturing facility can include system 400. The manufacturing facility can use system 400 to automate and standardize a material identification process. For example, a manufacturing facility can implement a plurality of scanners and RFID readers at various locations throughout the facility to track an item during a manufacturing process. The scanners and RFID readers can read, decode and transmit unique identification codes for each labeled item by way of network 410 to computer 412. The computer 412 can store the tracking information per item in database 414. The computer 412 can also retrieve information related to the identification codes associated with the item 404 from database 414 providing additional information about the item 404.

In some implementations, a manufacturing facility can include system 400 using only RFID readers (e.g., RFID reader 408) without using any scanners (e.g., scanner 406). The manufacturing facility may choose to identify and track items using the RFID readers. In some implementations, a retail facility (e.g., a department or big-box store) can include system 400 using only scanners (e.g., scanner 406) without using any RFID readers (e.g., RFID reader 408). The retail facility may choose to identify and track items using only bar code scanners. In some implementations, the system 400 may not include network 410. The scanner 406 and the RFID reader 408 may be directly connected to the computer 412. In some implementations, the connections between the scanner 406 and the network 410, the connection between the reader 408 and the network 410 and the connection between the network 410 and the computer 412 can be a combination of wired and wireless connections using a variety of available protocols for connectivity and data transmission between the devices and the network.

Figure 5:
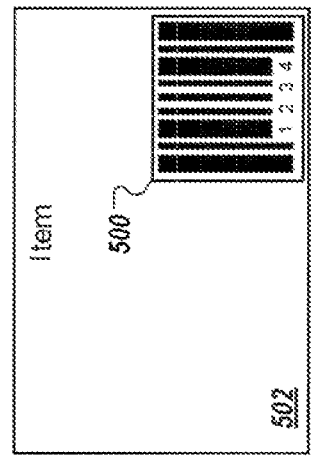
FIG. 5 is a diagram of an exemplar integrated smart label that can be attached to an item.

Referring now to FIG. 5, a diagram of an exemplar integrated smart label 500 can be affixed to an item 502 is shown. In the implementation in FIG. 5, a label printer can print integrated smart labels that can be applied to the item 502. For example, the label printer can print the integrated smart label 500 on a sheet or roll of adhesive labels where each label can be affixed to its associated item.

Figure 6:
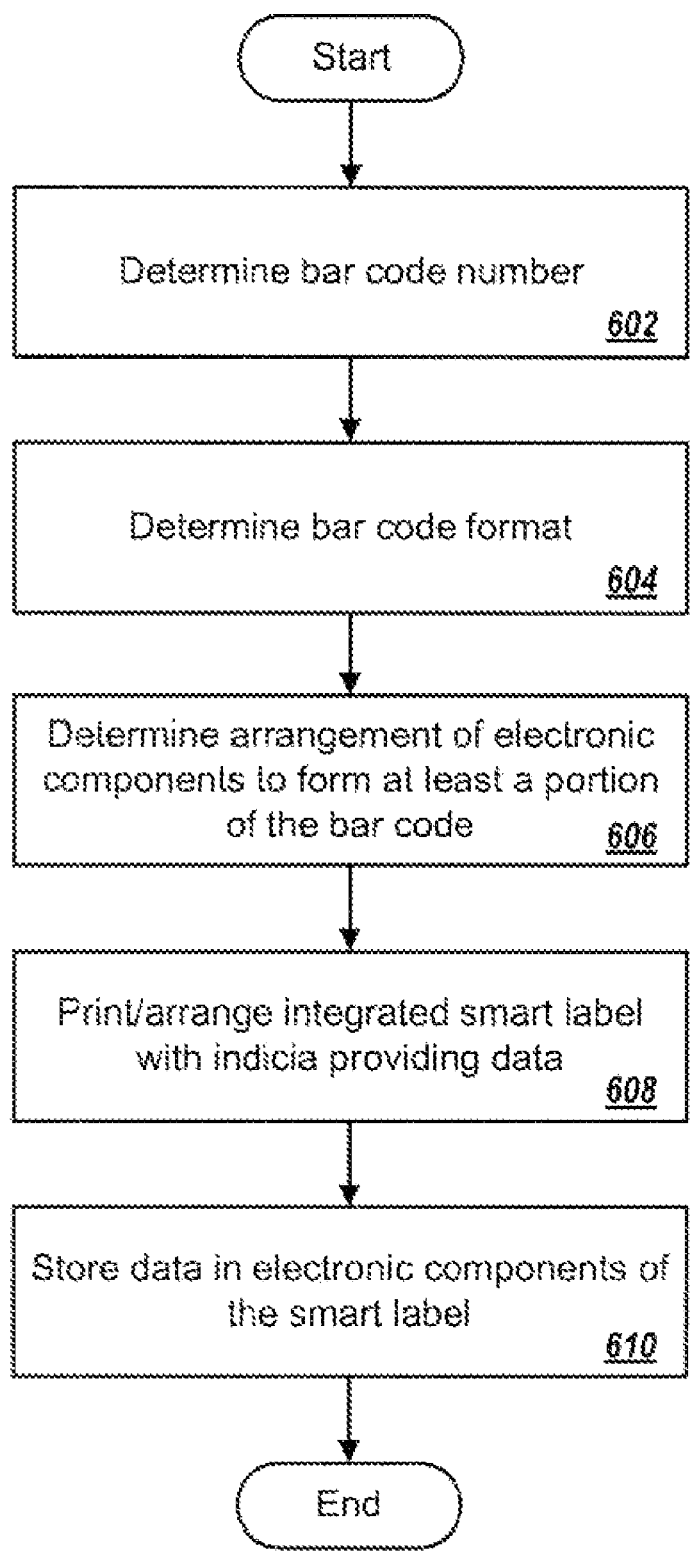
FIG. 6 is a flow chart illustrating exemplar steps that can be executed for printing electronic circuits in a pattern readable by a standard bar code reader.

FIG. 6 is a flow chart illustrating exemplar steps 500 that can be executed for printing electronic circuits in a pattern readable by a standard bar code reader. For example, the exemplar steps of FIG. 5 may be implemented using software instructions stored in a computer-readable storage medium and executed by a processing system including one or more processing apparatus, or processors.

In step 602, a bar code number is determined for an item. For example, a good or material (e.g., an item) in a manufacturing facility can be associated with a unique identification code. This identification code can be encoded in machine-readable indicia (e.g., a bar code) or in an RFID tag included with the item. For example, a system in a manufacturing facility (e.g., an enterprise resource planning system, a merchandise information system, a bar code printer system or an integrated smart label printer system) can determine the unique identification number for a bar code. The system can also determine additional unique identification numbers for the item to encode in the RFID tag. In some implementations, the system can randomly select unique identification codes for an item to then associate with the item. In some implementations, the system can select unique identification codes according to predefined standards (e.g., a GTIN for a bar code).

In step 604, the bar code format is determined. For example, a bar code generating system, which can be the same system as the system that determines the bar code, can generate a bar code for the unique identification code according to a pre-selected one-dimensional or two-dimensional bar code standard (e.g., UPC, Code 93, Code 128, semicode, QR code). For example, when using a one-dimensional bar code (e.g., machine-readable indicia 102 in FIGS. 1A and 1B) the bar code standard can determine the number, size and placement of the vertical bars in the bar code.

In step 606, electronic components can be printed or arranged to form at least a portion of the generated bar code. For example, the design of an RFID tag (e.g., the electronic components including a battery, antenna, transistors and memory) to use in an integrated smart label can be predetermined. For example, a system (e.g., the bar code generating system or another system) using the predetermined RFID tag design can determine the placement of the RFID tag components for the integrated smart label in the generated bar code. The system also determines how to connect the components after placement. The placement and connection of the RFID tag components in the generated bar code can be referred to as placement and routing.

Each electronic component of the RFID tag can include a profile that defines a portion of the machine-readable indicia (e.g., the generated bar code). As used herein, the term profile refers to the outline or contour of the indicia as viewed from a plan view. Each profile defines the portions of the machine-readable indicia included in each electronic component of an integrated smart label for all types of bar codes, including but not limited to, one-dimensional bar codes and two-dimensional bar codes. For example, referring to FIGS. 1A and 1B, the profiles for each of the electronic components is generally rectangular, the widths of the rectangles defining data.

The profiles for the antenna 112 can include the identified machine-readable indicia 112a-112d. The profile for the battery 106 can include the machine-readable indicia 106a. The profile for the memory 110 can include the machine-readable indicia 110a. The profile for the transistors 108 can include the machine-readable indicia 108a-c. Similarly, profiles can define the portions of the machine-readable indicia included in each of the electronic components for the exemplar bar codes illustrated in FIGS. 2A and 2B and FIGS. 3A and 3B. As described, in some implementations, there may be machine-readable indicia that are included in passive components. In these implementations, a profile for the passive components can include these machine-readable indicia.

In step 608, the integrated smart label can be printed. For example, a label printer using functional inks can print the integrated smart label by printing the electronic components in the generated bar code. As described with reference to FIGS. 1A, 1B, 2A, 2B, 3A and 3B, the printer can also print passive components in the generated bar code or use graphic arts inks to print indicium in the generated bar code that do not include electronic components. A standard bar code reader can read the integrated smart label. The printed integrated smart label inherently provides data that is defined by the profiles of the indicium. For example, the data can include a unique alpha-numeric identification code associated with an item (e.g., a serial number, a Universal Product Code (UPC), a Global Trade Item Number (GTIN)).

In step 610, data can be stored in the electronics portion of the integrated smart label (e.g., in memory). For example, the same unique identification code that is readable from the indicium can be electronically stored in memory of the integrated smart label. Additional data including, but not limited to, additional codes can also be electronically stored in the memory of the integrated smart label. In this manner, the electronically stored data can be defined as first data and the visually represented data can be defined as second data. In some implementations, the second data can include the first data and additional data.

In some implementations, the label printer can print the unique identification codes and data in the memory of the integrated smart label (e.g., by leaving out some interconnections in a memory matrix). This label printing implementation can result in the printing of read-only memory having data already stored therein. In some implementations, the label printer can print two types of memory. Read-only memory can include pre-written data when printing the memory, the data including unique identification codes for the RFID tag, for example. Read/write memory can be printed to allow the memory to be written at a later time (e.g., additional identification codes can be added to the RFID tag after label printing). For example, an article of clothing that includes a smart label can have pre-written printed read-only memory that includes a UPC code for the item. Additional read/write memory included in the RFID tag can be later written to include the price of the item.

In some implementations, a system (e.g., an enterprise resource planning system, a merchandise information system, a bar code printer system or an integrated smart label printer system) can perform the placement and routing of the printed electronics for the RFID tag in the generated bar code to produce an integrated smart label. The placement and routing process can determine the location of each electronic component within the generated bar code. The placement and routing process can also determine how to connect the electronic components after placement. The label printer can use this information to print the electronics and the complete integrated smart label.

The system can use design rules to determine the placement, routing and interconnection of the electronic components included in the integrated smart label. The design rules can include minimizing the length of the interconnections, minimizing the power consumption of the components, minimizing the heat production of the components or minimizing the interference between components. In some implementations, a user can predefine the placement of certain electronic components in the integrated smart label (e.g., an antenna). The placement and routing process can then determine the placement of the remaining components.

In some implementations, a library can include specifications for each electronic component (e.g., dimensions, power consumption) and variations of the electronic component that have the same functionality, but with different specifications. Using this library, the software for placement and routing can select the electrical component with the optimal specifications (e.g., the appropriate height, length and width) for use in the integrated smart label.

In some implementations, a system using appropriate software can perform placement and routing of the RFID tag electronic components with the requirement that the electronic circuit fit inside the schematic of the generated barcode. The software can select electronic components with the appropriate dimensions from the library of components as described above, choose the location of the components within the schematic of the generated barcode, and then determine where to place the interconnections between the components.

In some implementations, areas in the generated bar code not needed for electronic components may be filled with passive components that do not have any functionality and that do not need to be interconnected. This can force the placement and routing process to place the components of the electronic circuit inside the generated bar code.

A number of implementations of the present disclosure have been described. Nevertheless, it will be understood that various modifications may be made without departing from the spirit and scope of the present disclosure. Accordingly, other implementations are within the scope of the following claims.

What is claimed is:

1. An integrated smart label, comprising:
a plurality of electronic components, the plurality of electronic components including a plurality of respective profiles defining a plurality of specific outlines, wherein at least one of the electronic components stores first data; and
a pattern provided by an arrangement of the plurality of specific outlines, the pattern defining at least a machine-readable portion of a machine-readable indicia, the machine-readable indicia being a visual representation of second data that is optically readable by a reader device, and the second data being encoded by the arrangement.

2. The integrated smart label of claim 1, wherein at least one of the plurality of electronic components comprises printed electronics.

3. The integrated smart label of claim 1, wherein at least one of the plurality of electronic components comprises organic electronics.

4. The integrated smart label of claim 1, wherein the machine-readable indicia is further defined by at least one specific outline that is distinct from specific outlines of the plurality of electronic components.

5. The integrated smart label of claim 1, wherein the first data comprises the second data and additional data.

6. The integrated smart label of claim 1, wherein at least one of the plurality of electronic components comprises a color that is machine-detectable.

7. The integrated smart label of claim 1, wherein the plurality of electronic components comprises at least one of a memory, a circuitry, a battery and an antenna.

8. The integrated smart label of claim 1, wherein the plurality of electronic components defines a radio-frequency identification (RFID) tag.

9. The integrated smart label of claim 1, wherein the machine-readable indicia includes one of a one-dimensional indicia and a two-dimensional indicia.

10. A method of producing an integrated smart label, comprising:
generating a plurality of electronic components, each of the plurality of electronic components including a respective profile defining a specific outline;
arranging the plurality of electronic components such that specific outlines of the plurality of electronic components form a pattern that defines at least a machine-readable portion of a machine-readable indicia;
storing first data in at least one of the plurality of electronic components, the machine-readable indicia being a visual representation of second data that is optically readable by a reader device, and the second data being encoded by the pattern.

11. The method of claim 10, wherein generating the plurality of electronic components comprises printing at least one of the plurality of electronic components.

12. The method of claim 10, wherein at least one of the plurality of electronic components comprises organic electronics.

13. The method of claim 10, further comprising generating at least one specific outline that defines at least a portion of the machine-readable indicia and that is distinct from specific outlines of the plurality of electronic components.

14. The method of claim 10, wherein the plurality of electronic components comprises at least one of a memory, a circuitry, a battery and an antenna.

15. The method of claim 10, wherein the plurality of electronic components defines a radio-frequency identification (RFID) tag.

16. The method of claim 10, wherein the machine-readable indicia includes one of a one-dimensional indicia and a two-dimensional indicia.

17. A system for reading data, comprising:
an integrated smart label, comprising a plurality of electronic components, the plurality of electronic components each including a respective profile defining a specific outline arranged for forming a pattern that defines at least a machine-readable portion of a machine-readable indicia, at least one of the plurality of electronic components storing first data, the machine-readable indicia being a visual representation of second data that is optically readable by a reader device, and the second data being encoded by the pattern; and
a device for reading at least one of the first data and the second data from the integrated smart label.

18. The system of claim 17, wherein the integrated smart label is printed directly on an item.

19. The system of claim 17, wherein the integrated smart label is printed to a sticker that is subsequently affixed to an item.

20. The system of claim 17, wherein the device comprises at least one of an optical scanner and a smart label reader.

* * * * *